United States Patent
Chikano

(10) Patent No.: US 8,535,081 B2
(45) Date of Patent: Sep. 17, 2013

(54) SOLAR CELL PANEL CONNECTOR AND PANEL COUPLING BODY

(75) Inventor: Koji Chikano, Tokyo (JP)

(73) Assignee: Molex Incorporated, Lisle, IL (US)

( * ) Notice: Subject to any disclaimer, the term of this patent is extended or adjusted under 35 U.S.C. 154(b) by 0 days.

(21) Appl. No.: 13/445,629

(22) Filed: Apr. 12, 2012

(65) Prior Publication Data

US 2012/0264319 A1  Oct. 18, 2012

(30) Foreign Application Priority Data

Apr. 18, 2011 (JP) ................................. 2011-092436

(51) Int. Cl.
 *H01R 13/627* (2006.01)
(52) U.S. Cl.
 USPC .......................................................... 439/352
(58) Field of Classification Search
 USPC ................. 439/352, 350, 271, 278, 292, 372, 439/293
 See application file for complete search history.

(56) References Cited

U.S. PATENT DOCUMENTS

| | | | | |
|---|---|---|---|---|
| 4,203,646 A | * | 5/1980 | Desso et al. | 439/724 |
| 5,618,191 A | * | 4/1997 | Chikano et al. | 439/108 |
| 6,315,575 B1 | * | 11/2001 | Kajimoto | 439/33 |
| 6,437,236 B2 | * | 8/2002 | Watanabe et al. | 136/251 |
| 7,833,033 B2 | * | 11/2010 | McMahon et al. | 439/212 |
| 8,330,035 B2 | * | 12/2012 | Hattori | 136/244 |
| 2008/0190477 A1 | * | 8/2008 | Hattori | 136/246 |
| 2011/0021089 A1 | * | 1/2011 | Yoshida | 439/733.1 |
| 2012/0125402 A1 | * | 5/2012 | Schatz et al. | 136/246 |

* cited by examiner

*Primary Examiner* — Tulsidas C Patel
*Assistant Examiner* — Phuongchi T Nguyen
(74) *Attorney, Agent, or Firm* — Timothy M. Morella

(57) ABSTRACT

With the solar cell panel connector, first relay connector 5 possesses male type mating component 51 that is mountable-removable to female type mating component 45 of main connector 4 and possesses female type mating component 53 established at the opposite side, and second relay connector 6 possesses male type mating component 61 that is mountable-removable to female type mating component 46 of main connector 4 and possesses male type mating component 63 established at the opposite side. Female type mating component 53 of first relay connector 5 possesses a shape that is mountable-removable to male type mating component 63 of second relay connector 6, and male type mating component 63 of second relay connector 6 possesses as shape that is mountable-removable to female type mating component 53 of first relay connector 5.

11 Claims, 9 Drawing Sheets

SOLAR CELL PANEL CONNECTOR AND PANEL COUPLING BODY

REFERENCE TO RELATED APPLICATIONS

The Present Disclosure claims priority to prior-filed Japanese Patent Application No. 2011-092436, entitled "Solar Cell Panel Connector and Solar Cell Panel Coupling Body," filed on 18 Apr. 2011 with the Japanese Patent Office. The content of the aforementioned patent application is fully incorporated in its entirety herein.

BACKGROUND OF THE PRESENT DISCLOSURE

The Present Disclosure relates, generally, to solar cell panel connectors and panel coupling bodies, and, more particularly, to the coupling of solar cell panels.

Formerly, within conventional solar cell panels, there was installed a junction box for withdrawing to the outside the electric power that had been converted. Multiple solar cell panels were coupled by a cable installed to the junction box. In Japanese Patent Application No. 2006-310866, the content of which is incorporated in its entirety herein, there is disclosed technology for installing a junction box to the edge section of a solar cell panel. However, as disclosed in the '866 Application, the cable is installed directly to the junction box. Accordingly, the operation for coupling the solar cell panels is complex. A purpose of the Present Disclosure is to make the coupling of solar cell panels easy.

SUMMARY OF THE PRESENT DISCLOSURE

To solve the above-described problem, the solar cell panel connector of the Present Disclosure comprises a main unit connector to be installed on the edge section of the solar cell panel, a first relay connector and a second relay connector. The main unit connector possesses a first mating component that has been established on a first side of the direction along the edge section, as well as a second mating component established on the second side of the direction along the edge section. The first relay connector possesses a main unit side mating component that is mountable-removable to the first mating component of the main unit connector, as well as a coupling side mating component established on the opposite side of the direction along the edge section and in opposition to the main unit side mating component. The second relay connector possesses a main unit side mating component that is mountable-removable to the second mating component of the main unit connector, as well as a coupling side mating component established on the opposite side of the direction along the edge section and in opposition to the main unit side mating component. The coupling side mating component of the first relay connector possesses a shape that is mountable-removable to the coupling side mating component of the second relay connector, and the coupling side mating component of the second relay connector possesses a shape that is mountable-removable to the coupling side mating component of the first relay connector. In this way, there is enabled direct installing of the first relay connector established on one solar cell panel to the second relay connector established on another solar cell panel.

Additionally, as a substitute for the first relay connector and second relay connector, there is provided a relay cable on which is disposed at one end a mating component that is mountable-removable to the first mating component of the main unit connector, and on which is disposed at the other end a mating component that is mountable-removable to the second mating component of the main unit connector. In this way, there is enabled interposing of the relay cable between the main unit connector established on one solar cell panel and the main unit connector established on another solar cell panel.

Additionally, the first relay connector that has been mounted to the main unit connector protrudes outward from the end section of the first side of the solar cell panel, and the second relay connector mounted to the main unit connector protrudes outward from the end section of the second side of the solar cell panel. In this way, one-dimensional coupling of multiple solar cell panels is performed easily.

Additionally, the main unit side mating component of the first relay connector and the main unit side mating component of the second relay connector provide a girder component on which is disposed a hook component for latching, and on the first mating component and on the second mating component of the main unit connector there is formed a channel to which the described girder component is inserted and formed a hook component for engaging with the formerly described hook component. In this way, there is enabled suppressing of relay connector release from the main unit connector. It is also acceptable for the described girder component to be capable of elastic deformation in the inner surface direction of the solar cell panel. In this way, there are thinner mating components of the main unit connector and the relay connector in the thickness direction of the solar cell panel.

Additionally, one of either the coupling side mating component of the first relay connector or the coupling side mating component of the second relay connector provides a girder component on which is disposed a hook component for latching, and on the other of the components there is formed an insertion hole into which the girder component is inserted and formed a latching hole into which the hook component latches. In this way, there is enabled suppressing of relay connector release from the main unit connector. It is also acceptable for the described girder component to be capable of elastic deformation in the thickness direction of the solar cell panel. In this way, because the mating components of relay connector companions are positioned between two solar cell panels, the girder component has difficulty interfering with the solar cell panel, even when the girder component is elastically deformed in the thickness direction of the solar cell panel.

Additionally, the main unit side mating component and the coupling side mating component for one of either the first relay connector or the second relay connector respectively provide a girder component on which is disposed a hook component for latching, and the direction for which elastic transformation is possible for the girder component established on the main unit side mating component is made orthogonal to the direction for which elastic transformation is possible for the girder component established on the coupling side mating component. In this way, by causing reciprocal overlap of parts of the girder components, there is ability to shorten the distance between the main unit side mating component and the coupling side mating component.

To solve the above described problems, the solar cell panel connector of the Present Disclosure provides a main unit connector to be installed to the edge section of a solar cell panel, as well as a first relay connector and a second relay connector. The main unit connector possesses a first mating component disposed on a first side of the direction along the edge section and on which is placed a terminal that is electrically connected to the electrode of a first polarity of the solar cell panel, and possesses a second mating component disposed on the second side of the direction along the edge section and on which is placed a terminal that is electrically connected to the electrode of the second polarity of the solar cell panel. The first relay connector possesses a main unit side mating component that is mountable-removable to the first mating component of the main unit connector and on which is placed a terminal that will be electrically connected to the second polarity electrode of another solar cell panel. The second relay connector possesses a main unit side mating component that is mountable-removable to the second mating component of the main unit connector and on which is placed a terminal that will be electrically connected to the first polarity electrode of another solar cell panel. In this way, because there is provided a first and second relay connector that are mountable-removable to a main unit connector that is installed at the edge component of a solar cell panel, coupling of solar cell panels can be performed easily.

To solve the above described problem, the solar cell panel coupling body of the Present Disclosure also provides a plurality of solar cell panels as well as a plurality of solar cell panel connectors, disposed on each of the solar cell panels, which connectors are to be reciprocally coupled. Each described solar cell panel connector provides a main unit connector to be installed on the edge section of a solar cell panel, a first relay connector, and a second relay connector. The described main unit connector possesses a first mating component that has been established on a first side of the direction along the edge section, as well as a second mating component established on the second side of the direction along the edge section. The first relay connector possesses a main unit side mating component that is mountable-removable to the first mating component of the main unit connector, as well as a coupling side mating component established on the opposite side of the direction along the edge section and in opposition to the main unit side mating component. The second relay connector possesses a main unit side mating component that is mountable-removable to the second mating component of the main unit connector, as well as a coupling side mating component established on the opposite side of the direction along the edge section and in opposition to the main unit side mating component. The coupling side mating component of the first relay connector possesses a shape that is mountable-removable to the coupling side mating component of the second relay connector, and the coupling side mating component of the second relay connector possesses a shape that is mountable-removable to the coupling side mating component of the first relay connector. In this way, there is enabled direct installing of the first relay connector established at one solar cell panel to the second relay connector established at another solar cell panel.

Additionally, as a substitute for the first relay connector included in the solar cell panel connector established at one of two solar cell panels, and in substitution for the second relay connector included in the solar cell panel connector established at the other of the two solar cell panels, there is providing of a relay cable on which is disposed at one end a mating component that is mountable-removable to the first mating component of the main unit connector, and on which is disposed at the other end a mating component that is mountable-removable to the second mating component of the main unit connector. In this way, there is enabled interposing of the relay cable between the main unit connector established at one solar cell panel and the main unit connector established at another solar cell panel.

BRIEF DESCRIPTION OF THE FIGURES

The organization and manner of the structure and operation of the Present Disclosure, together with further objects and advantages thereof, may best be understood by reference to the following Detailed Description, taken in connection with the accompanying Figures, wherein like reference numerals identify like elements, and in which.

DESCRIPTION OF THE PREFERRED EMBODIMENTS

While the Present Disclosure may be susceptible to embodiment in different forms, there is shown in the Figures, and will be described herein in detail, specific embodiments, with the understanding that the disclosure is to be considered an exemplification of the principles of the Present Disclosure, and is not intended to limit the Present Disclosure to that as illustrated.

As such, references to a feature or aspect are intended to describe a feature or aspect of an example of the Present Disclosure, not to imply that every embodiment thereof must have the described feature or aspect. Furthermore, it should be noted that the description illustrates a number of features. While certain features have been combined together to illustrate potential system designs, those features may also be used in other combinations not expressly disclosed. Thus, the depicted combinations are not intended to be limiting, unless otherwise noted.

In the embodiments illustrated in the Figures, representations of directions such as up, down, left, right, front and rear, used for explaining the structure and movement of the various elements of the Present Disclosure, are not absolute, but relative. These representations are appropriate when the elements are in the position shown in the Figures. If the description of the position of the elements changes, however, these representations are to be changed accordingly.

Figure 1:
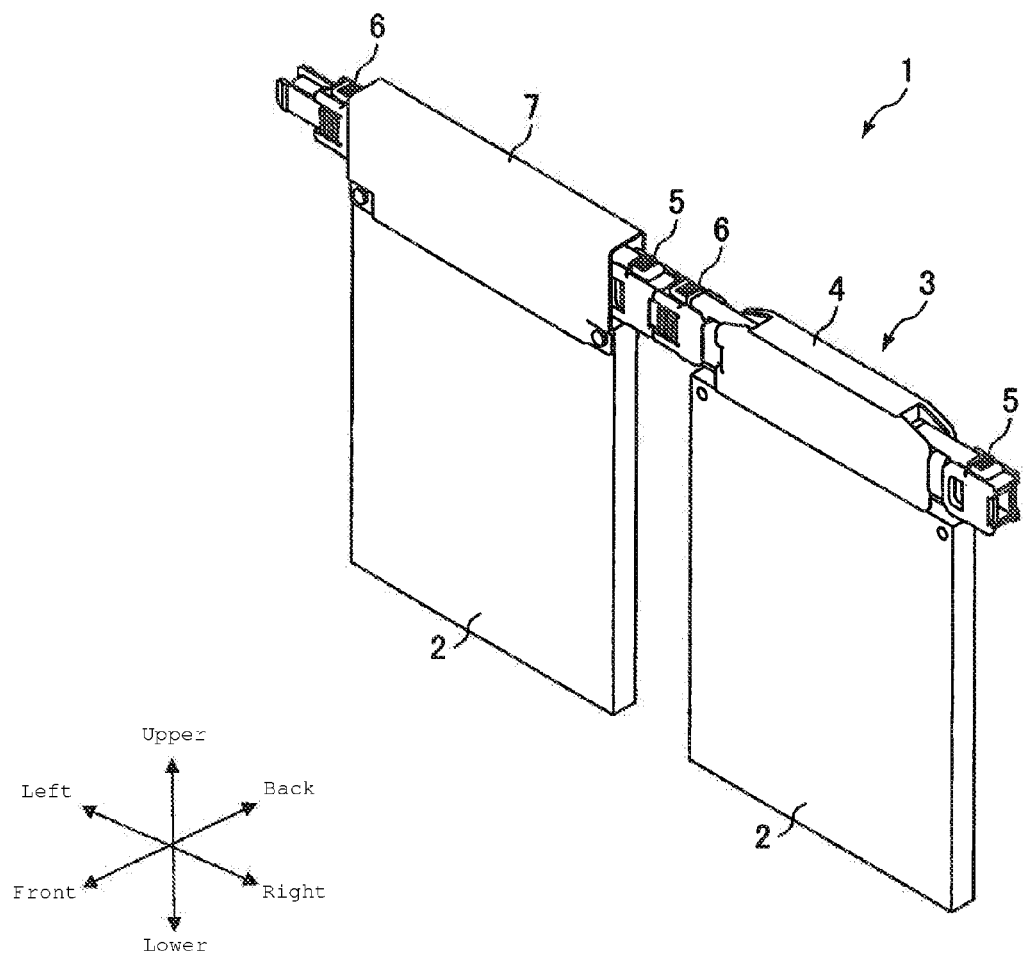
FIG. 1 is a perspective drawing that presents one section of the solar cell panel coupling body according to the Present Disclosure.
Figure 2A:
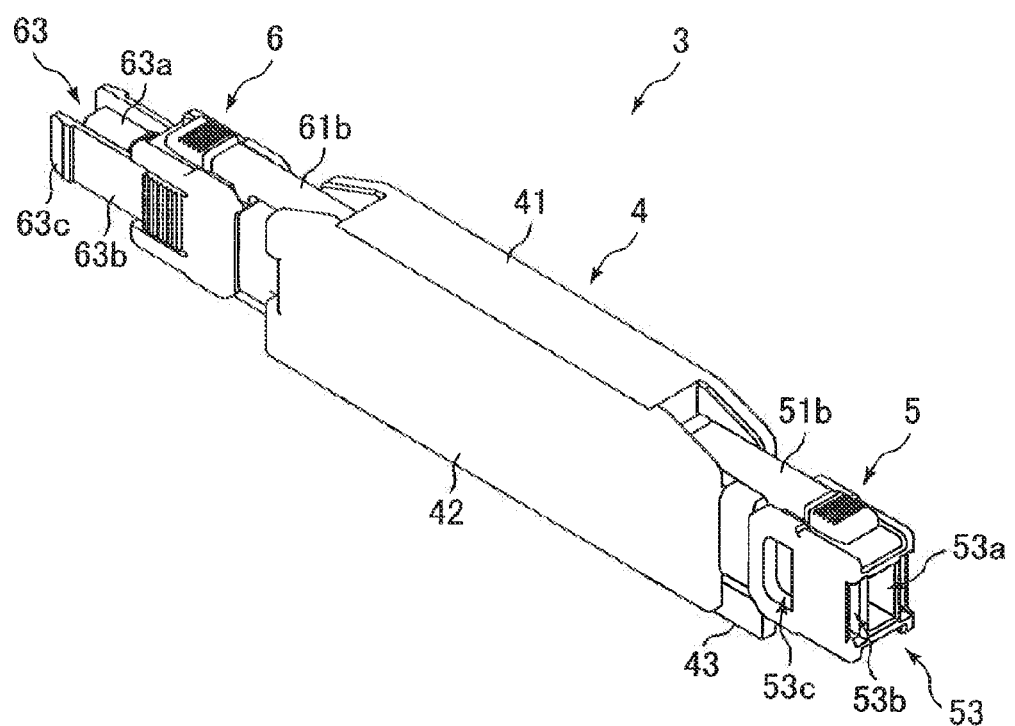
FIG. 2A is a perspective drawing that presents the solar cell panel connector according to the Present Disclosure.
Figure 2B:
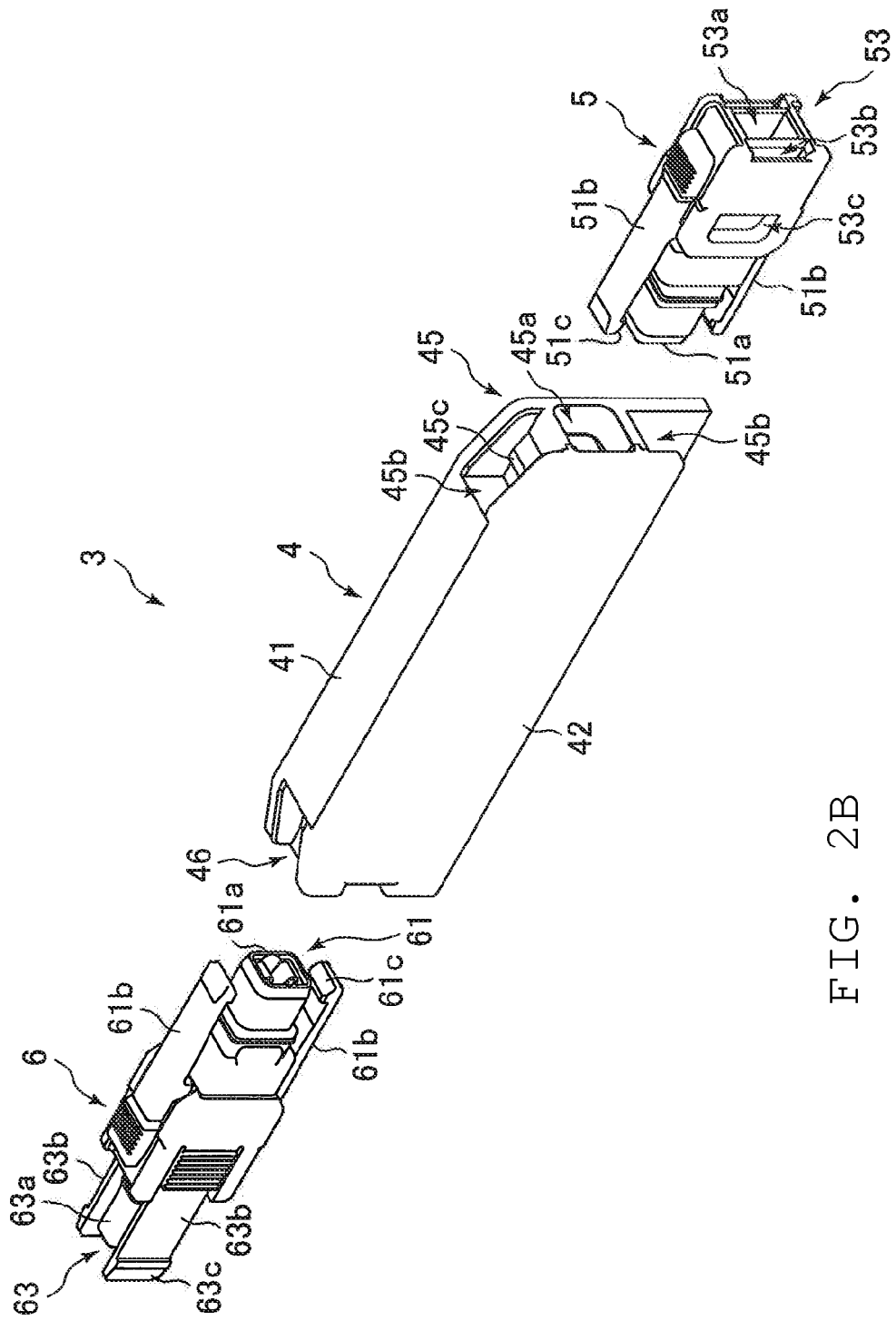
FIG. 2B is an exploded perspective drawing of the solar cell panel connector of FIG. 2A.

Referring to FIGS. 1-2, solar cell panel coupling body 1 includes a plurality of solar cell panel 2 as well as a plurality of connectors 3 disposed on each solar cell panel 2 and being reciprocally linked. Solar cell panel 2 is preferably formed in a rectangular shape. Each connector 3 includes main unit connector 4 for installation on the upper side edge section of solar cell panel 2, first relay connector 5 that is mountable-removable to the right side of main unit connector 4, and second relay connector 6 that is mountable-removable to the left side of main unit connector 4. These connectors 4, 5, 6 are structured by an insulating resin material, and a terminal of conducting metal material (not shown) is placed at the related inner side.

Main unit connector 4 is formed is an approximately rectangular box shape extending is the left-right direction, and the left-right direction width is slightly shorter than the left-right direction width of solar cell panel 2. Additionally, the thickness of the forward-aft direction of main unit connector 4 is slightly thicker than the thickness of the forward-aft direction thickness of solar cell panel 2. When first relay connector 5 is mounted to main unit connector 4, first relay connector 5 protrudes in the right direction from the end of the right side of solar cell panel 2. When second relay connector 6 is mounted to main unit connector 4, second relay connector 6 protrudes in the left direction from the end of the left side of solar cell panel 2.

Figure 3:
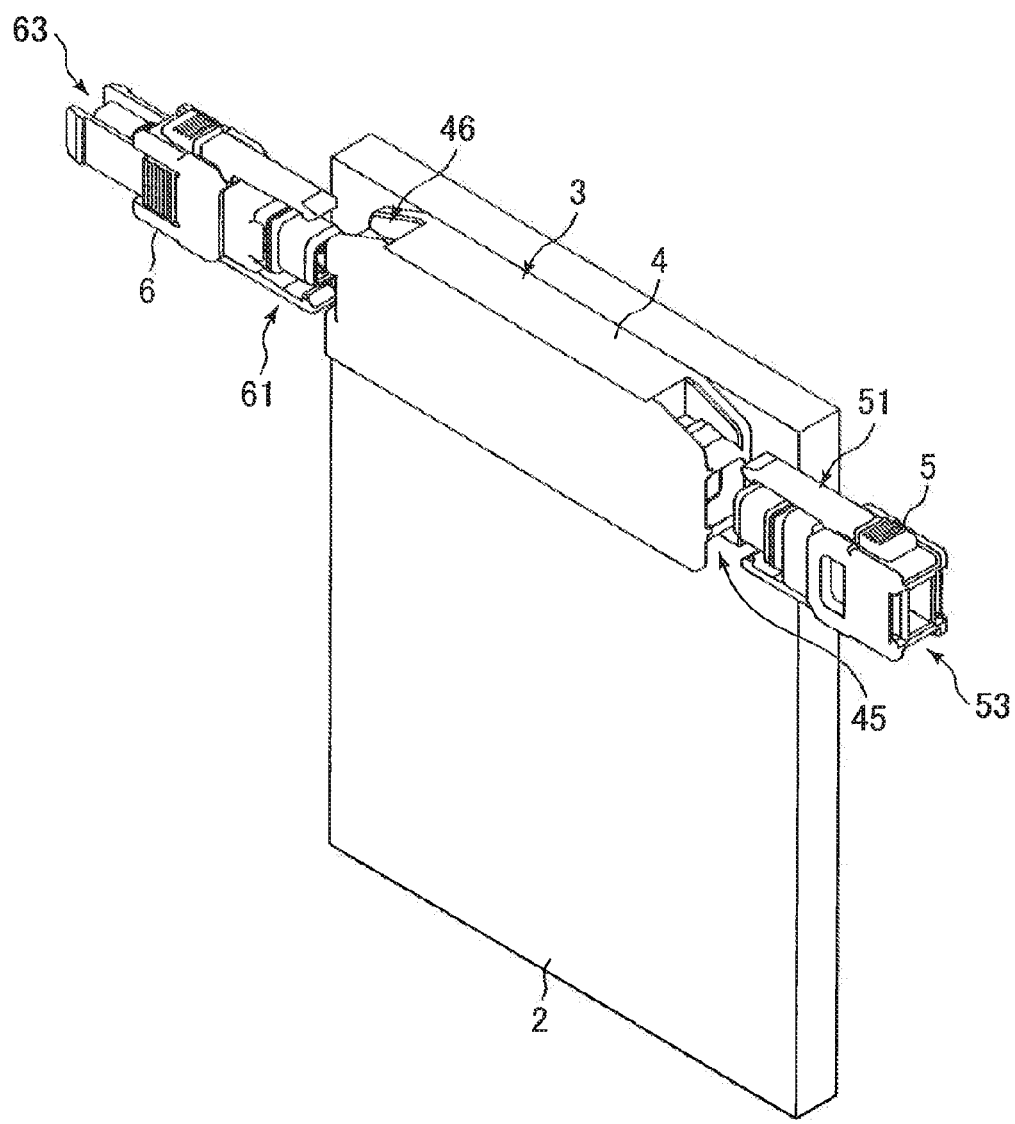
FIG. 3 is a perspective drawing that presents an installation example for the solar cell panel connector of FIG. 2A.

Main unit connector 4 includes cabinet 41 that stores the circuit for withdrawing the electric power converted by solar cell panel 2 to the exterior, lid component 42 installed on the front surface of cabinet 41, and rear surface component 43 extending in the lower direction from the rear section of cabinet 41. Main unit connector 4 is installed at the edge section at the upper side of solar cell panel 2 by such as an adhesive. Specifically, the lower surface of cabinet 41 is adhered to the upper surface of solar cell panel 2, and the front surface of rear surface component 43 is adhered to the rear surface of solar cell panel 2. Moreover, there is no limitation to such, and, as shown in FIG. 3, main unit connector 4 can be adhered to the front surface of the edge section at the upper side of solar cell panel 2.

Additionally, at the edge section at the upper side of solar cell panel 2, there is disposed approximately U-shaped cover 7 covering the front surface, upper surface and rear surface of main unit connector 4. Cover 7 is fixed to the front surface and rear surface of solar cell panel 2. Main unit connector 4 is fixed to the edge section at the upper side of solar cell panel 2 by cover 7.

To the edge section at the right side of main unit connector 4, there is disposed female type mating component 45 as the first mating component, and to the edge section at the left side of main unit connector 4, there is disposed female type mating component 46 as the second mating component. Female type mating component 45 includes insertion hole 45a opened facing the left direction, the pair of channel 45b formed above and below insertion hole 45a, and hook 45c disposed at the inner side of channel 45b. Female type mating component 46 includes a structure identical to that of female type mating component 45.

First relay connector 5 includes, at the end of the left side that faces main unit connector 4, male type mating component 51 as the main unit mating component, which is mountable-removable to female type mating component 45 of main unit connector 4. Component 51 includes insertion component 51a that extends in the left direction, the pair of girder 51b disposed above and below insertion component 51a, and hook 51c disposed on the leading end of girder 51b. When insertion component 51a mates with female type mating component 45 of main unit connector 4, insertion component 51a is inserted into insertion hole 45a of female type mating component 45, girder 51b is inserted into channel 45b of female type mating component 45, and hook 51c is engaged with hook 45c of female type mating component 45.

First relay connector 5 includes, at the end of the right side, being the side opposite male type mating component 51, female type mating component 53 as the coupling side mating component. Female type mating component 53 includes insertion hole 53a facing the right direction, the pair of insertion hole 53b, each of which is opened facing the right direction, and latching hole 53c formed at the interior of insertion hole 53b.

Second relay connector 6 includes, at the end of the right side that faces main unit connector 4, male type mating component 61 as the main unit side mating component, which is mountable-removable to female type mating component 46 of main unit connector 4. Male type mating component 61 includes insertion component 61a extending in the right direction, the pair of girder 61b disposed above and below insertion component 61a, and hook 61c disposed on the leading end of girder 61b. In the same way that male type mating component 51 mates, so does male type mating component 61 mate with female type mating component 46.

Second relay connector 6 includes, at the end of the left side, being the side opposite male type mating component 61, male type mating component 63 as the coupling side mating component. Male type mating component 63 includes insertion component 63a that extends in the left direction, the pair of girder 63b that are disposed forward and aft of insertion component 63a and that extend in the left direction, and hook 63c disposed on the leading end of girder 63b.

Female type mating component 53 disposed at the end of the left side of first relay connector 5 and male type mating component 63 disposed at the end of the right side of second relay connector 6 are reciprocally mountable-removable. When female type mating component 53 and male type mating component 63 mate, insertion component 63a of male type mating component 63 is inserted into insertion hole 53a of female type mating component 53, girder 63b of male type mating component 63 is inserted into insertion hole 53b of female type mating component 53, and hook 63c of male type mating component 63 engages with latching hole 53c of female type mating component 53.

With this shape, female type mating component 53 of first relay connector 5 is mountable-removable to the male type mating component 63 of second relay connector 6 which has been established at connector 3 of another solar cell panel 2. Additionally, male type mating component 63 of second relay connector 6 also is mountable-removable to the female type mating component 53 of first relay connector 5 established at connector 3 of another solar cell panel 2.

Figure 4:
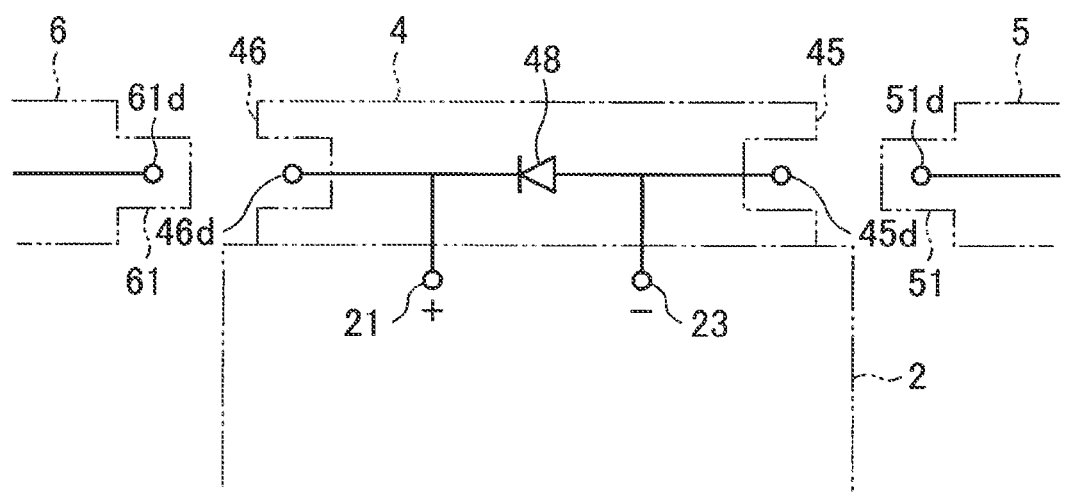
FIG. 4 is a circuit drawing that presents a circuit structure example of the interior of the solar cell panel connector of FIG. 2A.

FIG. 4 is a circuit diagram that presents a structural circuit example within the interior of connector 3. Positive electrode 21 and negative electrode 23 are disposed at the edge section at the upper side of solar cell panel 2. To positive electrode 21 of solar cell panel 2, there is connected, through use of wiring, terminal 46d placed at female type mating component 46 of main unit connector 4. To negative electrode 23 of solar cell panel 2, there is connected, through use of wiring, terminal 45d placed at female type mating component 45 of main unit connector 4. In addition, there is disposed bypass diode 48 between terminal 45d placed at female type mating component 45 and terminal 46d placed at female type mating component 46.

When female type mating component 45 of main unit connector 4 is mated to male type mating component 51 of first relay connector 5, terminal 45d placed at female type mating component 45 of main unit connector 4 contacts terminal 51d placed at male type mating component 51 of first relay connector 5. When female type mating component 46 of main unit connector 4 is mated to male type mating component 61 of second relay connector 6, terminal 46d placed at female type mating component 46 of main unit connector 4 contacts terminal 61d placed at male type mating component 61 of second relay connector 6.

Figure 5:
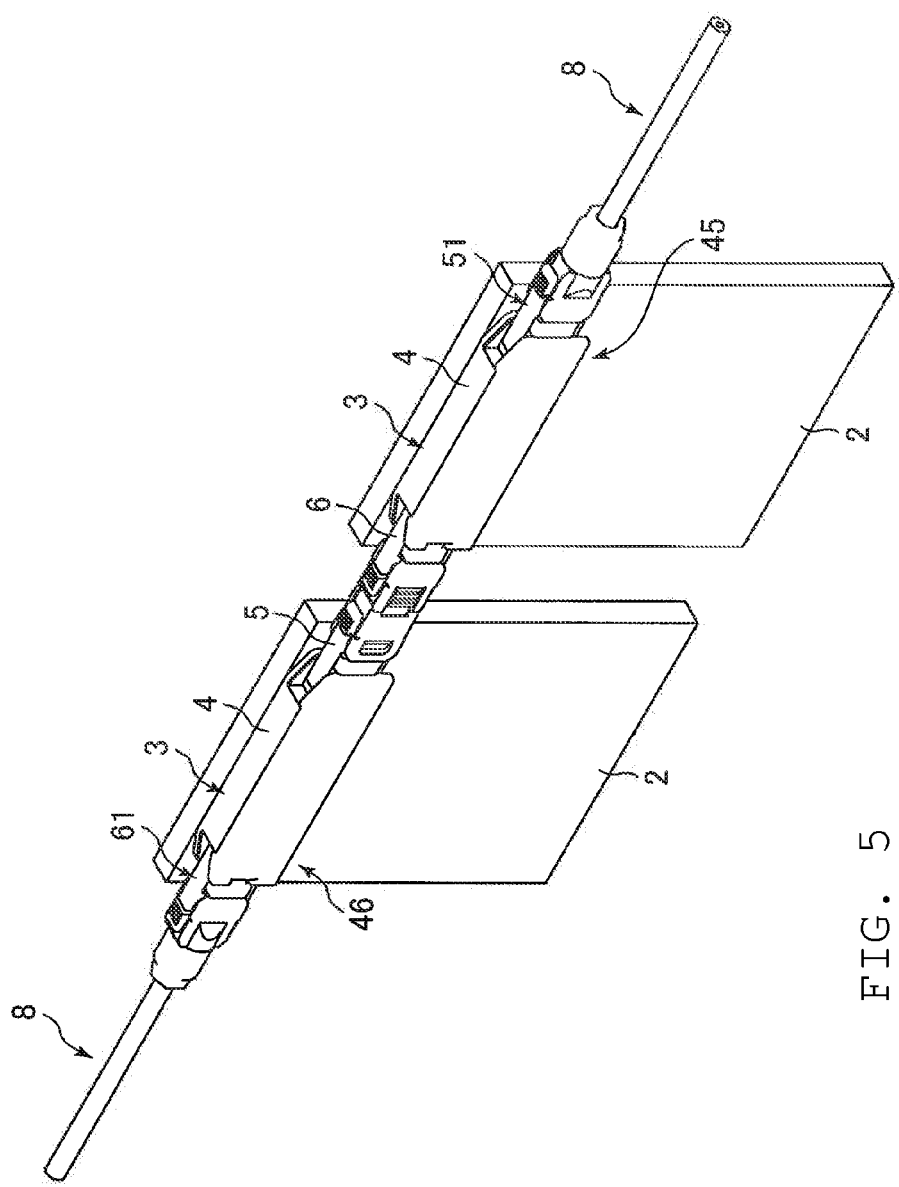
FIG. 5 is a perspective drawing that presents the solar cell panel connector of FIG. 2A according to a first transformed example.

FIG. 5 is a perspective drawing that presents the solar cell panel connector according to a first transformed example. The following section omits a detailed description of structures duplicated from the above described implementation mode, while using identical symbols. With the above described implementation mode, main unit connector 4 installed on each of solar cell panel 2 was reciprocally coupled by means of a set of first relay connector 5 and second relay connector 6, but with this example, relay cable 8 is disposed in substitution for a portion of the sets of first relay connector 5 and second relay connector 6.

For example, on one side of the left-right direction, main unit connector 4 is connected to another main unit connector 4 by means of a set of first relay connector 5 and second relay connector 6, but on the other side of the left-right direction, main unit connector 4 is connected to another main unit connector 4 by means of relay cable 8. To the end of the left side of relay cable 8, there is disposed male type mating component 51, mountable-removable to female type mating component 45 disposed at the right end of main unit connector 4. To the end of the right side of relay cable 8, there is disposed male type mating component 61, mountable-removable to female type mating component 46 disposed at the left end of main unit connector 4.

Figure 6:
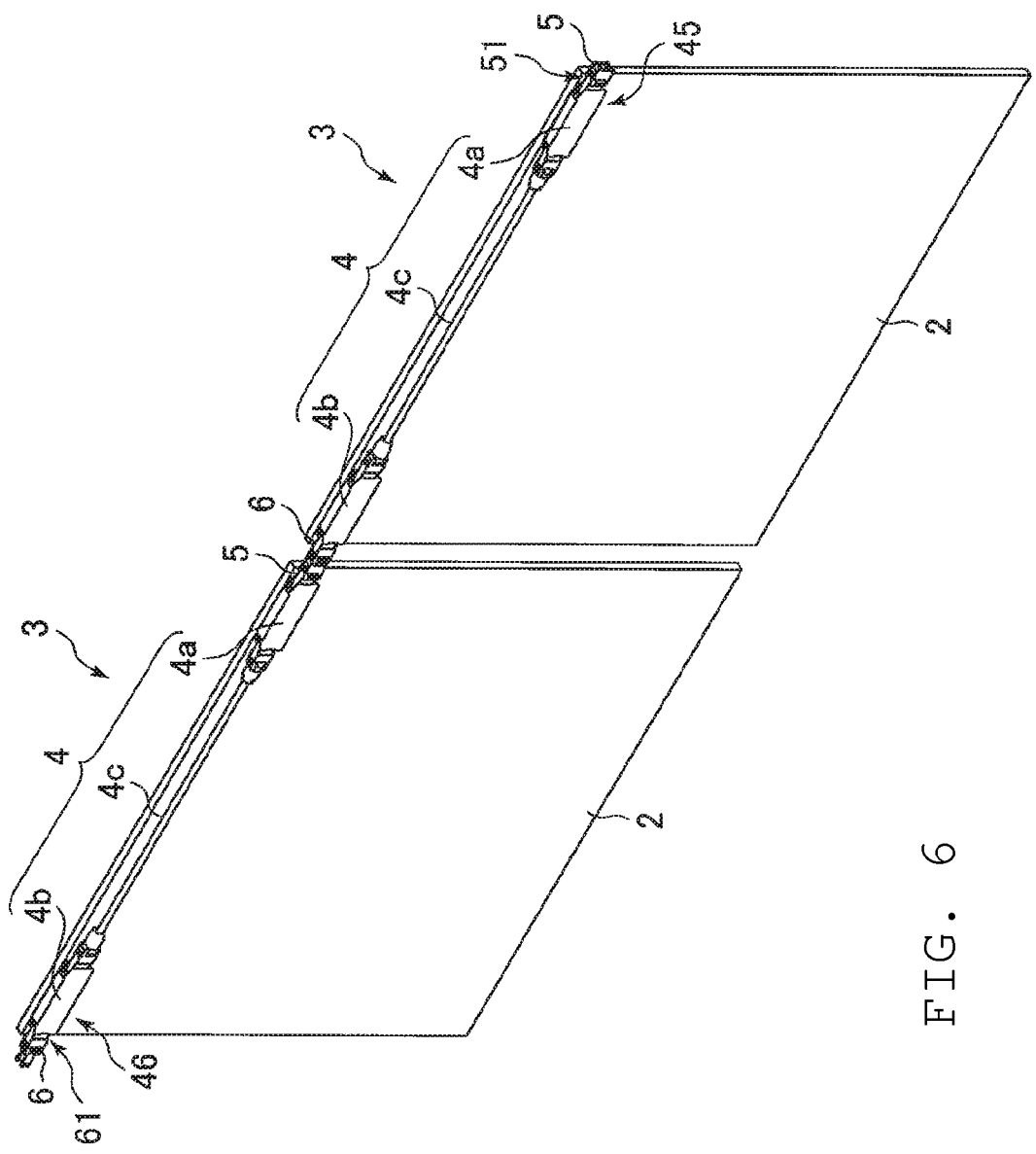
FIG. 6 is a perspective drawing that presents the solar cell panel connector of FIG. 2A according to a second transformed example.

FIG. 6 is a perspective drawing that presents the solar cell panel connector according to a second transformed example. The following section omits a detailed description of structures duplicated from the above described implementation modes, while using identical symbols. With this example, main unit connector 4 includes right side main unit component 4a and left side main unit component 4b disposed with separation to the left and right at the edge section of the upper side of solar cell panel 2, and includes relay cable 4c disposed between them. Right side main unit component 4a, which is disposed at the edge section of the right side of solar cell panel 2, includes female type mating component 45 that is mountable-removable to male type mating component 51 of first relay connector 5. Left side main unit component 4b, which is disposed at the edge section of the left side of solar cell panel 2, includes female type mating component 46 that is mountable-removable to male type mating component 61 of second relay connector 6.

Terminal 45d connected to negative electrode 23 of solar cell panel 2, shown in FIG. 4, is housed in right side main unit component 4a of FIG. 6, and terminal 46d connected to positive electrode 21 of solar cell panel 2, shown in FIG. 4, is housed in left side main unit component 4b of FIG. 6. Bypass diode 48 is housed in one of either right side main unit component 4a or left side main unit component 4b of FIG. 6, and the wiring for connecting to bypass diode 48 is included in relay cable 4c of FIG. 6. Relay cable 4c is coupled to right side main unit component 4a and left side main unit component 4b by a mode identical to that for relay cable 8 and main unit connector 4 of FIG. 5, for example.

Figure 7:
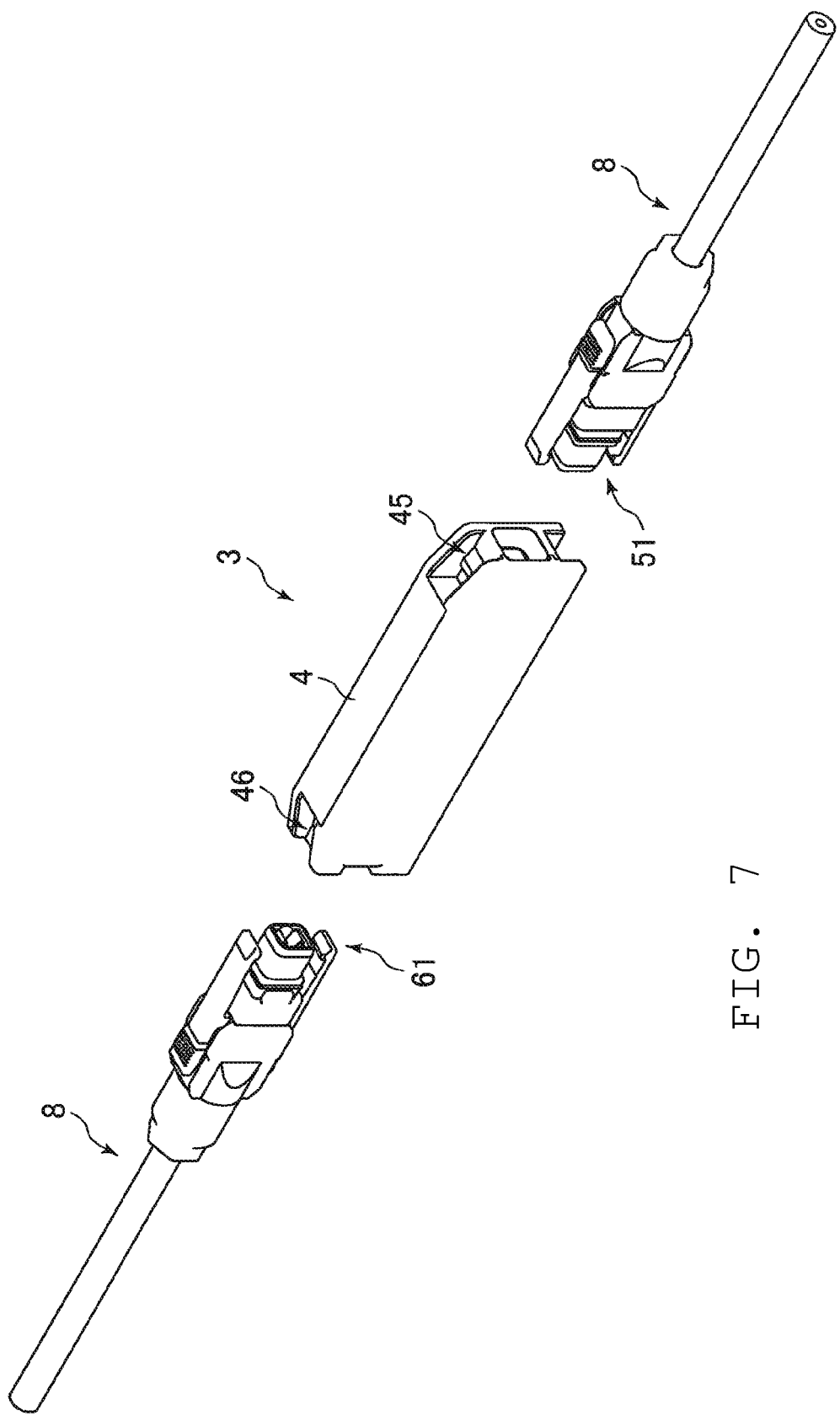
FIG. 7 is a perspective drawing that presents the solar cell panel connector of FIG. 2A according to a third transformed example.

FIG. 7 is a perspective drawing that presents the solar cell panel connector according to a third transformed example. The following section omits a detailed description of structures duplicated from the above described implementation modes, while using identical symbols. With the above described implementation modes, main unit connector 4 installed on each of solar cell panel 2 was reciprocally connected by means of a set of first relay connector 5 and second relay connector 6, but it is acceptable to use relay cable 8 in substitution for this, as shown in FIG. 7. To the end of the left side of relay cable 8, there is disposed male type mating component 51 that is mountable-removable to female type mating component 45 disposed at the end of the right side of main unit connector 4. To the end of the right side of relay cable 8, there is disposed male type mating component 61 that is mountable-removable to female type mating component 46 disposed at the end of the left side of main unit connector 4.

Figure 8:
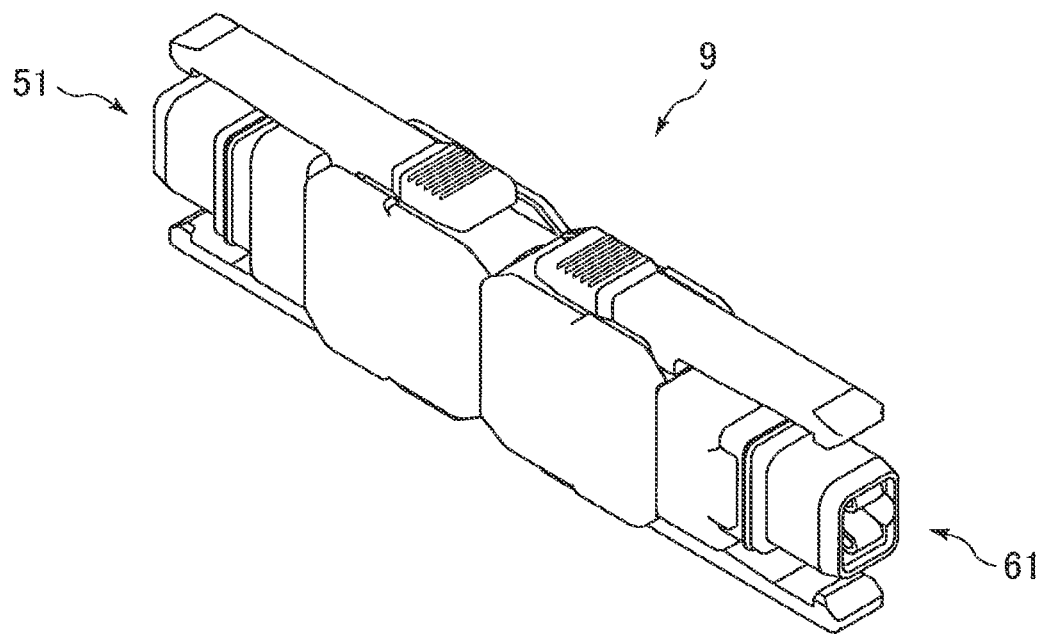
FIG. 8 is a perspective drawing that presents the solar cell panel connector of FIG. 2A according to a fourth transformed example.

FIG. 8 is a perspective drawing that presents the solar cell panel connector according to a fourth transformed example. The following section omits a detailed description of structures duplicated from the above described implementation modes, while using identical symbols. With the above described implementation modes, main unit connector 4 installed on each of solar cell panel 2 was reciprocally connected by means of a set of first relay connector 5 and second relay connector 6, but it is acceptable to use relay connector 9 in substitution for this, as shown in FIG. 8. To the end of the left side of relay connector 9, there is disposed male type mating component 51 that is mountable-removable to female type mating component 45 disposed at the end of the right side of main unit connector 4. To the end of the right side of relay connector 9, there is disposed male type mating component 61 that is mountable-removable to female type mating component 46 disposed at the end of the left side of main unit connector 4.

While a preferred embodiment of the Present Disclosure is shown and described, it is envisioned that those skilled in the art may devise various modifications without departing from the spirit and scope of the foregoing Description and the appended Claims.

What is claimed is:

1. A solar cell panel connector, comprising:
   a main unit connector that is to be installed at the edge section of a solar cell panel and that possesses a first mating component disposed on a first side of the direction along the edge section, and a second mating component disposed on the second side of the direction along the edge section;
   a first relay connector that possesses a main unit side mating component that is mountable-removable to the first mating component of the main unit connector, as well as a coupling side mating component established on the opposite side of the direction along the edge section and in opposition to the main unit side mating component; and
   a second relay connector that possesses a main unit side mating component that is mountable-removable to the second mating component of the main unit connector, as well as a coupling side mating component established on the opposite side of the direction along the edge section and in opposition to the main unit side mating component;
   wherein:
      the coupling side mating component of the first relay connector possesses a shape that is mountable-removable to the coupling side mating component of the second relay connector; and
      the coupling side mating component of the second relay connector possesses a shape that is mountable-removable to the coupling side mating component of the first relay connector.

2. The solar cell panel connector according to claim 1 that includes, in substitution for the first relay connector and second relay connector, a relay cable on which is disposed at one end a mating component that is mountable-removable to the first mating component of the main unit connector, and on which is disposed at the other end a mating component that is mountable-removable to the second mating component of the main unit connector.

3. The solar cell panel connector according to claim 2, wherein:
the first relay connector that has been mounted to the main unit connector protrudes outward from the end section of the first side of the solar cell panel; and
and the second relay connector mounted to the main unit connector protrudes outward from the end section of the second side of the solar cell panel.

4. The solar cell panel connector according to claim 3, wherein:
the main unit side mating component of the first relay connector and the main unit side mating component of the second relay connector provide a girder component on which is disposed a hook component for latching; and
on the first mating component and on the second mating component of the main unit connector there is formed a channel to which the described girder component is inserted and formed a hook component for engaging with the formerly described hook component.

5. The solar cell panel connector according to claim 4 wherein the described girder component is capable of elastic deformation in the inner surface direction of the solar cell panel.

6. The solar cell panel connector according to claim 5, wherein one of either the coupling side mating component of the first relay connector or the coupling side mating component of the second relay connector includes a girder component on which is disposed a hook component for latching, and on the other of the components there is formed an insertion hole into which the girder component is inserted and formed a latching hole into which the hook component latches.

7. The solar cell panel connector according to claim 6, wherein the described girder component is capable of elastic deformation in the thickness direction of the solar cell panel.

8. The solar cell panel connector according to claim 7, wherein:
the main unit side mating component and the coupling side mating component for one of either the first relay connector or the second relay connector respectively provide a girder component on which is disposed a hook component for latching; and
the direction for which elastic transformation is possible for the girder component established on the main unit side mating component is made orthogonal to the direction for which elastic transformation is possible for the girder component established on the coupling side mating component.

9. A solar cell panel connector, comprising:
a main unit connector to be installed to the edge section of a solar cell panel, and the main unit connector possesses a first mating component disposed on a first side of the direction along the edge section and on which is placed a terminal that is electrically connected to the electrode of a first polarity of the solar cell panel, and possesses a second mating component disposed on the second side of the direction along the edge section and on which is placed a terminal that is electrically connected to the electrode of the second polarity of the solar cell panel;
a first relay connector that possesses a main unit side mating component that is mountable-removable to the first mating component of the main unit connector and on which is placed a terminal that will be electrically connected to the second polarity electrode of another solar cell panel; and
a second relay connector that possesses a main unit side mating component that is mountable-removable to the second mating component of the main unit connector and on which is placed a terminal that will be electrically connected to the first polarity electrode of another solar cell panel.

10. A solar cell panel coupling body, comprising:
a plurality of solar cell panels as well as a plurality of solar cell panel connectors, disposed on each of the solar cell panels, which connectors are to be reciprocally coupled;
wherein each solar cell panel connector comprises:
a main unit connector to be installed on the edge section of a solar cell panel, which connector possesses a first mating component that has been established on a first side of the direction along the edge section, as well as a second mating component established on the second side of the direction along the edge section;
a first relay connector possessing a main unit side mating component that is mountable-removable to the first mating component of the main unit connector, as well as a coupling side mating component established on the opposite side of the direction along the edge section and in opposition to the main unit side mating component; and
a second relay connector possessing a main unit side mating component that is mountable-removable to the second mating component of the main unit connector, as well as a coupling side mating component established on the opposite side of the direction along the edge section and in opposition to the main unit side mating component;
wherein:
by the coupling side mating component of the first relay connector possessing a shape that is mountable-removable to the coupling side mating component of the second relay connector; and
by the coupling side mating component of the second relay connector possessing a shape that is mountable-removable to the coupling side mating component of the first relay connector.

11. The solar cell panel coupling body according to claim 10, wherein:
in substitution for the first relay connector included in the solar cell panel connector established at one of two solar cell panels, and in substitution for the second relay connector included in the solar cell panel connector established at the other of the two solar cell panels; and
a relay cable on which is disposed at one end a mating component that is mountable-removable to the first mating component of the main unit connector, and on which is disposed at the other end a mating component that is mountable-removable to the second mating component of the main unit connector.

* * * * *